United States Patent [19]
Lottes et al.

[11] Patent Number: 5,891,250
[45] Date of Patent: Apr. 6, 1999

[54] INJECTOR FOR REACTOR

[75] Inventors: Charles R. Lottes, Ballwin; Thomas A. Torack, Oakland, both of Mo.

[73] Assignee: MEMC Electronic Materials, Inc., St. Peters, Mo.

[21] Appl. No.: 72,564

[22] Filed: May 5, 1998

[51] Int. Cl.[6] .................................................. C23C 16/00
[52] U.S. Cl. ......................................................... 118/715
[58] Field of Search ............................................. 118/715

[56] References Cited

U.S. PATENT DOCUMENTS

| | | | |
|---|---|---|---|
| 5,269,847 | 12/1993 | Anderson et al. | 118/715 |
| 5,411,590 | 5/1995 | Hawkins et al. | 118/715 |
| 5,421,288 | 6/1995 | Ohta et al. | 118/724 |
| 5,455,070 | 10/1995 | Anderson et al. | 427/248.1 |
| 5,458,918 | 10/1995 | Hawkins et al. | 118/715 |
| 5,525,157 | 6/1996 | Hawkins et al. | 118/715 |

*Primary Examiner*—Richard Bueker
*Attorney, Agent, or Firm*—Senniger, Powers, Leavitt & Roedel

[57] ABSTRACT

A reactor for depositing an epitaxial layer on a semiconductor wafer contained within the reactor during a chemical vapor deposition process. The reactor comprises a reaction chamber sized and shaped for receiving a semiconductor wafer and an inlet passage in communication with the reaction chamber for delivering reactant gas to the reaction chamber. In addition the reactor includes a susceptor positioned in the reaction chamber for supporting the semiconductor wafer during the chemical vapor deposition process. Further, the reactor comprises an injector including a metering plate generally blocking reactant gas flow through the inlet passage. The plate has a slot extending through the plate totally within a periphery of the plate. The slot is sized for selectively restricting reactant gas flow past the plate thereby to meter reactant gas delivery to the chamber.

18 Claims, 4 Drawing Sheets

INJECTOR FOR REACTOR

BACKGROUND OF THE INVENTION

This invention relates generally to a reactor for depositing an epitaxial layer on a semiconductor wafer, and more particularly to a reactor including an injector having slots for metering reactant gas flow through the reactor.

Conventional horizontal reactors have a reaction chamber extending horizontally between an entrance and an exit for admitting and venting reactant gas to and from the chamber, respectively. During the chemical vapor deposition process, a semiconductor wafer is positioned on a rotatable susceptor positioned in the reaction chamber, and reactant gas is delivered to the chamber through an inlet passage connected to the entrance of the chamber. The flowrate of the reactant gas passing over the wafer is critical to the thickness profile and electrical properties of the epitaxial layer formed on the wafer during the chemical vapor deposition. To ensure the desired properties are achieved, the gas is metered by an injector positioned along the inlet passage.

The injector includes a metering fixture having one or more large openings through which the gas passes when traveling to the reactor. Blades or metering plates fastened across the openings in the metering fixture partially block the openings and form narrow slots through which the reactant gas flows. These slots limit the flowrate of the reactant gas delivered to the reaction chamber. Each blade is held in place with screw fasteners so its position is adjustable relative to the openings. As the blade position is adjusted, the flow area and thus the flowrate through the slots changes. The blade positions may be adjusted so the slots upstream from the center of the reaction chamber are wider than those upstream from the sides of the chamber. This results in more gas passing over the center of the wafer to increase the thickness of the epitaxial layer at the center. If the slot widths corresponding to the sides and center of the reaction chamber are equal, an undesirable concave epitaxial surface results.

The reactant gas flowrate is a function of the width of the slots. More particularly, the flowrate through each slot is a function of the cube of the width of the slot. As a result of this relationship, the gas flowrates through the slots are highly dependent upon their widths. For instance, if a slot width is 0.004 inches when 0.003 inches is desired, the flowrate through the slot will be nearly 240 percent of the desired flowrate. Thus, it may be seen that precise control of the slot width is required to produce the desired epitaxial layer. Presently, such control is difficult to achieve. The blades can shift as the screw fasteners holding them are tightened, causing deviations from the desired in slot width and thus flowrate.

Moreover, because the slot is formed between the edges of the blade and the opening in the metering fixture, gas passing through the slot travels along the wall of the opening. As a result, flow downstream from the injector is easily disturbed by discontinuities in the wall of the inlet passage. Such flow disturbances can negatively affect the quality of epitaxial layers produced by the reactor.

In order to alleviate large flowrate variations due to set-up variability and the potential for flow disturbances, another type of blade which is sized to entirely cover the injector openings has been conceived. These blades have a series of holes drilled through them to allow reactant gas to pass through the blades. Although these blades eliminate flowrate variation caused by set-up variability, they increase flowrate variation caused by the machining tolerances of the holes in the blades. Flow through a circular hole is a function of its diameter to the fourth power. Thus, the flowrate through a 0.004 inch diameter hole is about 320 percent of the flowrate through a 0.003 inch diameter hole. As will appreciated by those skilled in the art, large flowrate variations can result from small discrepancies in the injector hole diameters. Moreover, since the hole diameters are fixed, the blades must be replaced rather than adjusted if different flowrates are desired.

SUMMARY OF THE INVENTION

Among the several objects of the present invention may be noted the provision of a reactor having predictable and repeatable reactant gas flowrates; the provision of such a reactor which produces wafers having flat epitaxial layers; the provision of such a reactor which produces wafers having predictable and repeatable epitaxial layer thicknesses; the provision of such a reactor which eliminates flowrate variability due to set-up variability; and the provision of such a reactor having an injector which directs flow through the center of an inlet passage of the reactor.

Briefly, apparatus of this invention is a reactor for depositing an epitaxial layer on a semiconductor wafer contained within the reactor by a chemical vapor deposition process. The reactor generally comprises a reaction chamber sized and shaped for receiving a semiconductor wafer and an inlet passage in communication with the reaction chamber for delivering reactant gas to the reaction chamber. In addition, the reactor includes a susceptor positioned in the reaction chamber for supporting the semiconductor wafer during the chemical vapor deposition process. Further, the reactor comprises an injector including a metering plate generally blocking reactant gas flow through the inlet passage. The plate has a slot extending through the plate totally within a periphery of the plate. The slot is sized for selectively restricting reactant gas flow past the plate thereby to meter reactant gas delivery to the chamber.

In another aspect, apparatus of this invention is an injector for use in a reactor for depositing an epitaxial layer on a semiconductor wafer supported within the reactor during a chemical vapor deposition process. The injector comprises a metering plate having a slot extending through the plate totally within a periphery of the plate. The slot is sized for selectively restricting reactant gas flow past the plate thereby to meter reactant gas delivery to the reactor.

Other objects and features of the invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
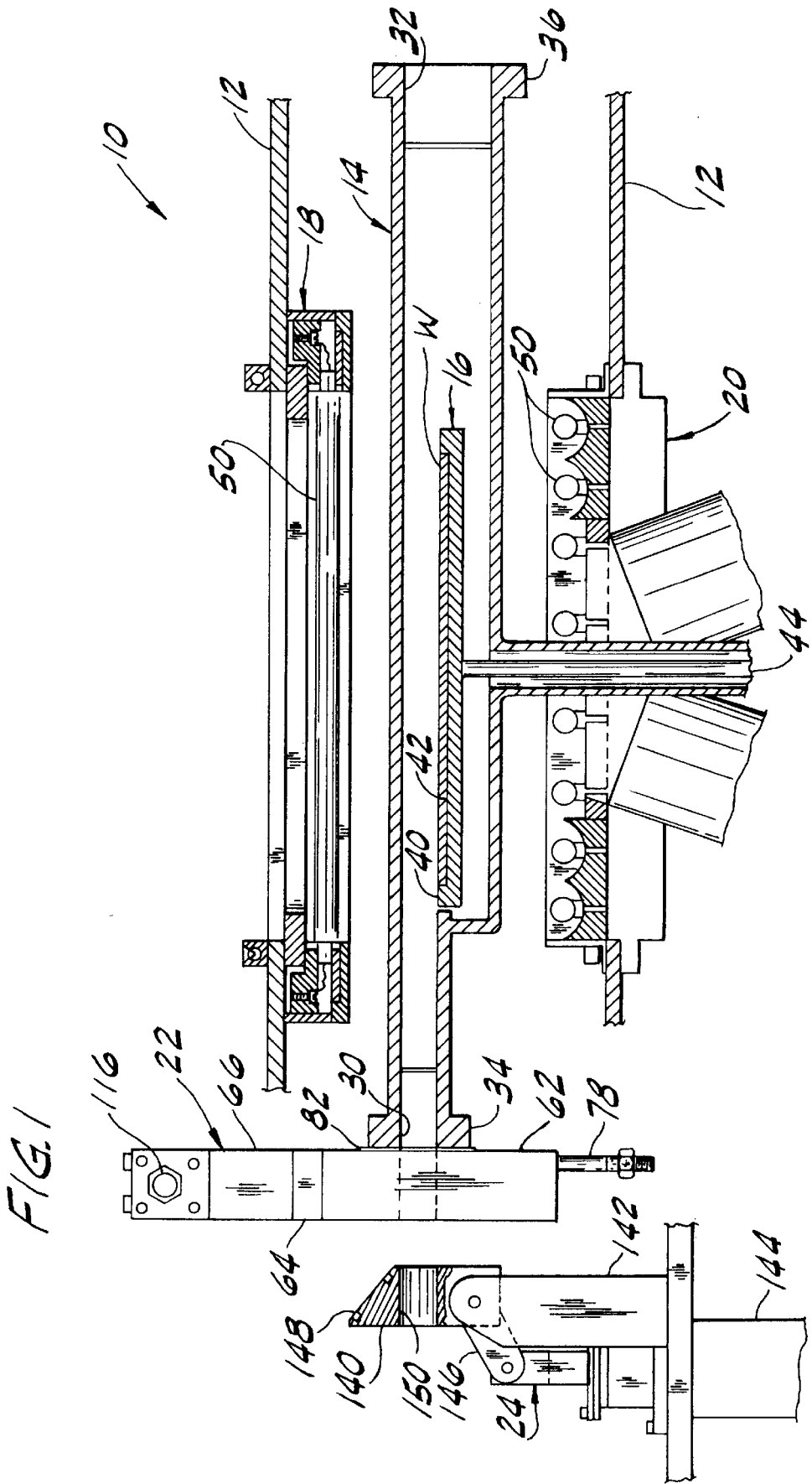
FIG. 1 is a schematic, fragmentary side elevation in partial section of a reactor of the present invention.

Referring now to the drawings and in particular to FIG. 1, a horizontal reactor for depositing an epitaxial layer on a semiconductor wafer W is identified in its entirety by the reference numeral 10. The reactor 10 is housed in an enclosure 12 (partially shown) and generally comprises a reaction chamber 14, a susceptor 16, upper and lower heating arrays 18 and 20, respectively, an injector 22, and a gate assembly 24 (the reference numerals designating their subjects generally.)

The reaction chamber 14, which is sized and shaped for receiving the semiconductor wafer W, extends horizontally between an entrance 30 for admitting reactant gas to the chamber and an exit 32 for venting reactant gas from the chamber. Both the entrance 30 and exit 32 have flanges 34, 36, respectively, for releasably connecting the reaction chamber 14 to process piping (only partially shown) which transports the reactant gas to and from the chamber. As will be explained in greater detail below, the wafer W is inserted and removed from the chamber 14 through the entrance 30 by a robot (not shown) before and after the chemical vapor deposition process. Although other materials may be used without departing from the scope of the present invention, the reaction chamber 14 of the preferred embodiment is made of quartz.

The susceptor 16 includes a turntable 40 having a circular recess 42 in its upper side for receiving a wafer W. The turntable 40 is mounted on a shaft 44 which slowly rotates the turntable during the chemical vapor deposition process to evenly distribute epitaxial material and thermal energy over the surface of the wafer W. Although the shaft 42 is illustrated as being connected directly to the turntable 40, a conventional three-armed bracket (not shown) may be mounted on the upper end of the shaft for holding the turntable.

As further shown in FIG. 1, the upper and lower heating arrays 18, 20 include infrared heat lamps 50 which direct thermal radiation toward the susceptor 16 to heat the semiconductor wafer W and susceptor during the vapor deposition process. Except for the injector 22, each of the previously described reactor components is conventional and will not be described in further detail. Although other reactors are also envisioned as being within the scope of the present invention, the components of the reactor 10 of the preferred embodiment described above are from an Epsilon I Epitaxial Epi reactor manufactured by Advanced Semiconductor Materials America Inc. of Phoenix, Ariz.

Figure 2:
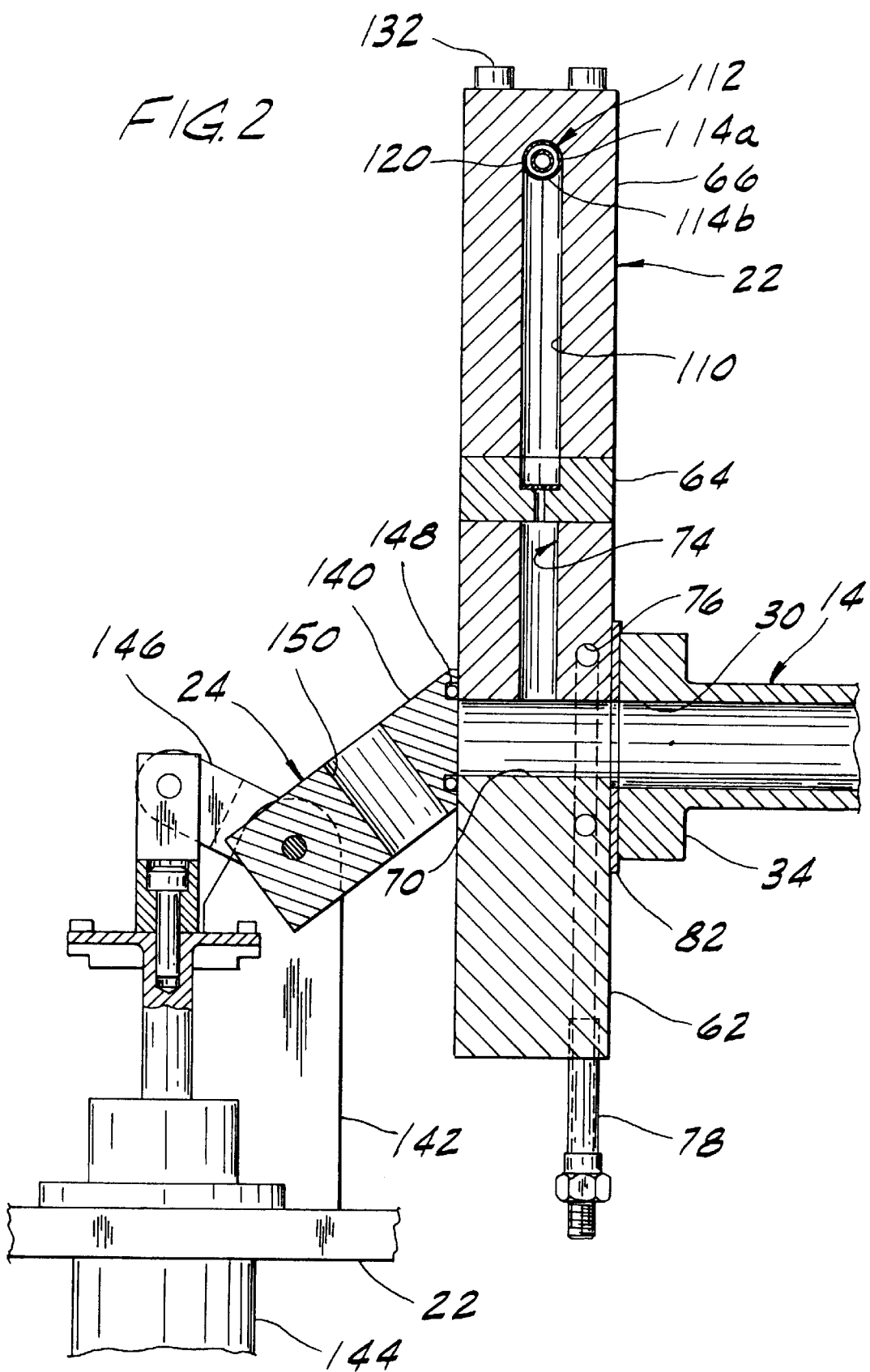
FIG. 2 is enlarged fragmentary detail elevation of the reactor showing an injector thereof in section and a gate in a closed position.
Figure 3:
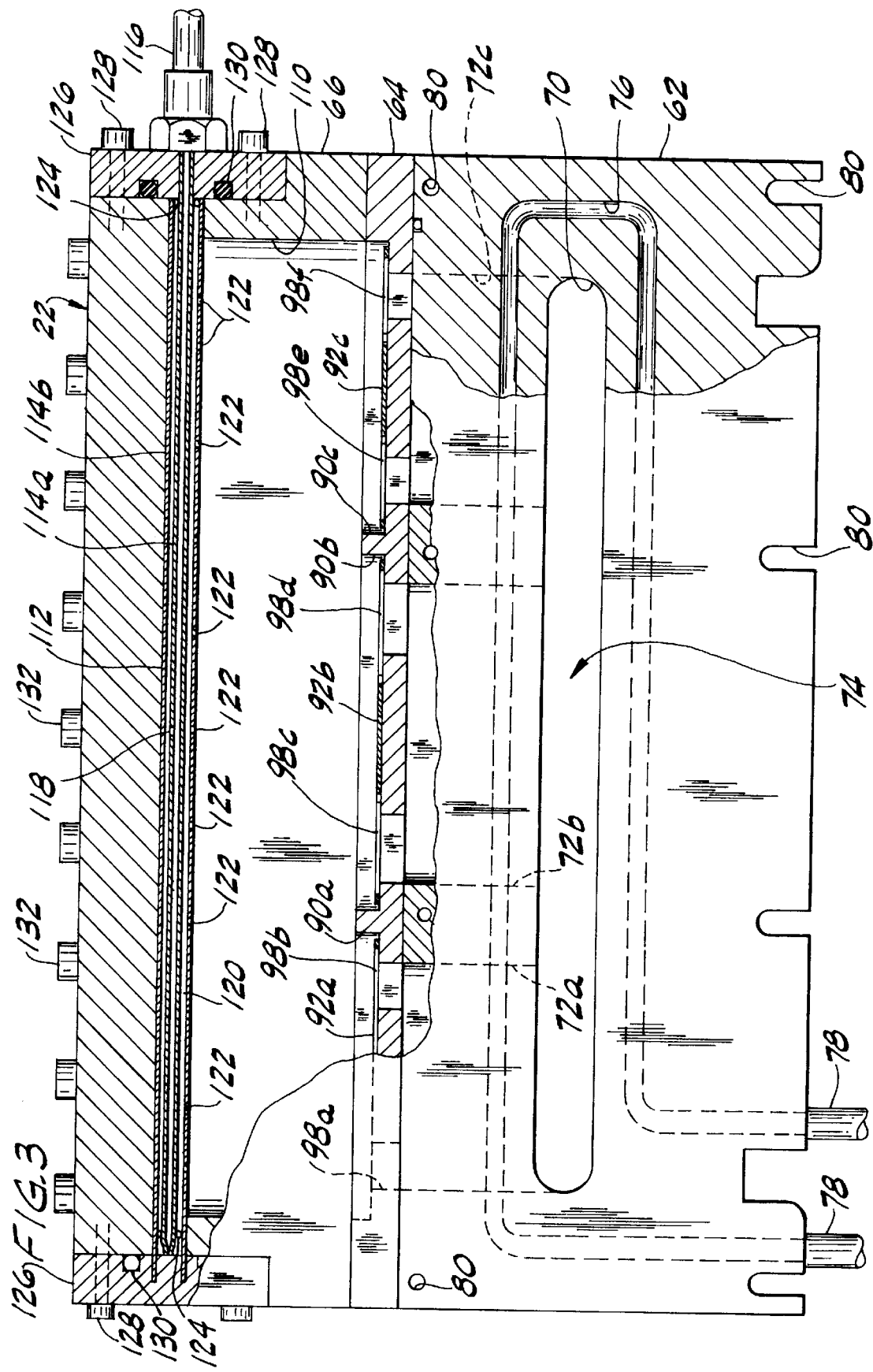
FIG. 3 is an end elevation of the reactor broken away to show internal construction.

As shown in FIG. 2, the injector 22 generally comprises an inlet body 62, a metering fixture 64, and a plenum 66. The inlet body 62 has a horizontal passage 70 extending entirely through the body. This passage 70 is aligned with the entrance 30 of the reaction chamber 14 when the injector 22 is installed adjacent the chamber to permit wafers W to pass through the passage when loading and unloading the reactor 20. As shown in FIG. 3, three vertical passages 72a–72c extend upward from the horizontal passage 70 to an upper end of the inlet body 62. Together, the horizontal and vertical passages 70 and 72a–72c form a part of an inlet passage, generally designated 74, for delivering reactant gas to the reaction chamber 14. A cooling passage 76 surrounds the horizontal passage 70 for circulating cooling water through the body 62. Tubes 78 extending downward from the body 62 communicate with opposite ends of the cooling passage 76 for transporting cooling water to and from the injector 22. Holes 80 are providing in the inlet body 62 for fastening the injector 22 to the housing 12 to hold the body against the entrance 30 of the reaction chamber 14. As illustrated in FIG. 2, a gasket 82 seals the interface between the inlet body 62 and the reaction chamber 14.

Figure 4:
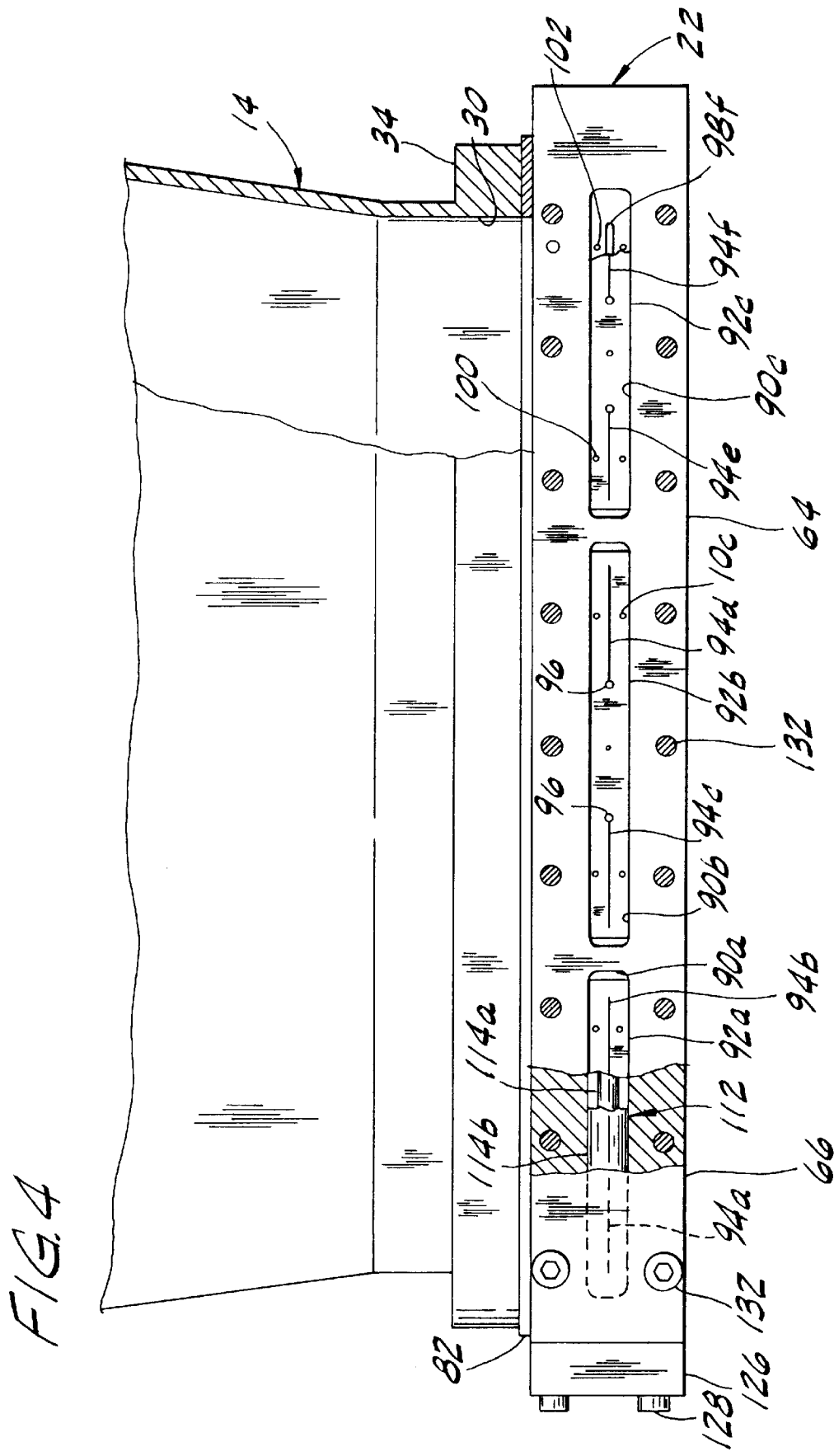
FIG. 4 is a fragmentary top plan of the reactor broken away to show internal construction.

As shown in FIG. 3, the metering fixture 64 includes three recesses 90a–90c for holding metering plates 92a–92c over the vertical passages 72a–72c of the inlet body 62 to generally block reactant gas flow through the inlet passage 74. As illustrated in FIG. 4, each plate 92a–92c has two slots 94a–94f extending through the plate totally within a periphery of the plate. Each slot 94a–94f is sized for selectively restricting reactant gas flow past the respective plate 92a–92c to meter reactant gas delivery to the reaction chamber 14. For instance, each slot may have a length of about one inch and a width of less than about 0.02 inches. More preferably, each slot has a width of between about 0.002 inches and about 0.015 inches.

In the most preferred embodiment, the slots upstream from the central portion of the susceptor 16 (i.e., the central slots 94c and 94d which meter reactant gas passing over the central portion of a wafer W supported by the susceptor) are wider than the slots positioned on opposite ends of the central slots (i.e., the side slots 94a, 94b, 94e and 94f). This arrangement causes a larger volume of reactant gas to pass over the central portion of the wafer than passes over the edge margin of the wafer. Further, this arrangement results in a flatter epitaxial surface and reduces the potential for an undesirable concave epitaxial surface. Although other arrangements are envisioned as being within the scope of the present invention, the central slots 94c, 94d of the preferred embodiment have widths of less than about 0.02 inches and the side slots 94a, 94b, 94e, 94f have widths of less than about 0.01 inches. More preferably, the central slots 94c, 94d have widths of between about 0.009 inches and about 0.015 inches and the side slots 94a, 94b, 94e, 94f have widths of between about 0.002 inches and about 0.005 inches. In addition, each of the slots has a generally uniform width along its respective length.

Although other methods are envisioned for making the slots 94a–94f in the metering plates 92a–92c of the present invention, the slot of the preferred embodiment are made by wire electrical discharge machining. Small (e.g., about 3/32 inch) starter holes 96 are made in the plates 92a–92c to start the slots 94a–94f. Although these holes 96 may be filled (e.g., by brazing or welding), in the most preferred embodiment, they are positioned so they are blocked by the fixture 64 as will be explained below.

As shown in FIG. 3, six slots 98a–98f are provided in the metering fixture 64. Each of these slots is positioned below one of the slots 94a–94f in the metering plates 92a–92c to permit the reactant gas passing through the metering plates to freely pass into the respective vertical passage 72a–72c in the inlet body 62. The slots 98a–98f in the metering fixture 64 are shorter than the slots 94a–94f in the metering plates 92a–92c. For example, the slots 98c, 98d in the metering fixture 64 corresponding to the central slots 94c, 94d in metering plate 92b may have lengths of about 0.75 inches and the slots 98a, 98b, 98e, 98f in the metering fixture corresponding to the side slots 94a, 94b, 94e, 94f in metering plates 92a, 92c may have lengths of about 0.50 inches. Preferably, the slots 98a–98f in the metering fixture 64 overlap the slots 94a–94f in the plates 92a–92c so the ends of the slots in the plates are blocked. As alluded to above, this configuration eliminates the need to fill the starter holes 96 in the metering plates. However, the holes 96 must be spaced far enough from the ends of the slots 98a–98f in the metering fixture 64 to prevent lengthwise flow through the slots 94a–94f in the plates 92a–92c. As shown in FIG. 4, holes 100 are provided in the metering plates 92a–92c for fastening the plates to the fixture 64 with fasteners (not shown). Corresponding holes 102 in the fixture 64 may be tapped to accept these fasteners.

As illustrated in FIG. 3, a cavity 110 extends upward from the lower end of the plenum 66 to deliver reactant gas to the metering plates 92a–92c at a substantially constant pressure. A manifold, generally designated 112, is formed by a pair of nested tubes 114a, 114b. The manifold extends lengthwise through the plenum 66 at the upper end of the cavity 110. The inner tube 114a communicates with piping 116 (partially shown) connected to a reactant gas source (not shown) for delivering reactant gas to the injector 14. A hole 118 midway along the top of the inner tube 114a allows the reactant gas to enter an annular passage 120 formed between the inner and outer tubes 114a, 114b. A series of holes 122 along the bottom of the outer tube 114b allows the gas to enter the cavity 110 below the manifold 112. As will be understood by those skilled in the art, this manifold configuration distributes reactant gas across the cavity 110 at a substantially constant pressure.

O-rings 124 are provided at each end of the manifold for centering the inner tube 114a within the outer tube 114b. In addition, the downstream end of the inner tube 114a (to the left as shown in FIG. 3) is crimped to prevent gas from entering the annular passage 120 through the end. An end plate 126 is fastened to each end of the plenum 66 with screw fasteners 128. Each tube 114a, 114b is attached to one of these end plates 126 so the tubes enter the cavity 110 from opposite ends of the plenum 66. O-rings 130 are provided between the end plates 126 and the plenum 66 to prevent gas from leaking out of the cavity 110. The plenum 66 and metering fixture 64 are fastened to the inlet body 62 with bolts 132. Although the injector 22 may be made of other materials without departing from the scope of the present invention, the injector the preferred embodiment is made substantially of a stainless steel alloy.

As illustrated in FIG. 2, the gate assembly 24 is mounted on the housing 12 adjacent the injector 22. The assembly 24 comprises a gate 140 pivotally mounted on a bracket 142 extending upward from the housing 112. A pneumatic actuator 144 connected to the gate 140 by a linkage 146 opens and closes the gate for permitting wafers W to be loaded and unloaded. When the actuator 144 is extended as shown in FIG. 2, the gate 140 blocks the horizontal passage 70 through the inlet body 62. An o-ring 148 mounted on the gate 140 seals the inlet passage 74 when the gate is closed. However, when the actuator 144 is retracted as shown in FIG. 1, the gate 140 pivots to an open position. An opening 150 provided in the gate 140 permits a robot arm (not shown) and wafer W to enter the reaction chamber 14 through the horizontal passage in the inlet body 62 when the gate is open.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A reactor for depositing an epitaxial layer on a semiconductor wafer contained within the reactor by a chemical vapor deposition process, the reactor comprising:
    a reaction chamber sized and shaped for receiving a semiconductor wafer;
    an inlet passage in communication with the reaction chamber for delivering reactant gas to the reaction chamber;
    a susceptor positioned in the reaction chamber for supporting the semiconductor wafer during the chemical vapor deposition process; and
    an injector including a metering plate generally blocking reactant gas flow through the inlet passage, the plate having a slot extending through the plate totally within a periphery of the plate, said slot being sized for selectively restricting reactant gas flow past the plate thereby to meter reactant gas delivery to the chamber.

2. A reactor as set forth in claim 1 wherein the slot has a width of less than about 0.02 inches.

3. A reactor as set forth in claim 2 wherein said slot has a width of between about 0.002 inches and about 0.015 inches.

4. A reactor as set forth in claim 1 wherein said slot is a central slot positioned upstream from a central portion of the susceptor for metering reactant gas passing over a central portion of a wafer supported by the susceptor, and the injector has at least two side slots positioned adjacent to opposite ends of the central slot, each of said side slots being positioned upstream from opposing outer portions of the susceptor for metering reactant gas passing over corresponding outer portions of the wafer.

5. A reactor as set forth in claim 4 wherein said central and side slots have generally uniform widths along their respective lengths.

6. A reactor as set forth in claim 4 wherein each of said side slots has a width less than a width of said central slot.

7. A reactor as set forth in claim 6 wherein said central slot has a width of less than about 0.02 inches and each side slot has a width of less than about 0.01 inches.

8. A reactor as set forth in claim 7 wherein said central slot has a width of between about 0.009 inches and about 0.015 inches and wherein each side slot has a width of between about 0.002 inches and about 0.005 inches.

9. A reactor as set forth in claim 1 wherein said injector comprises:
    an inlet body adapted for attachment to the reaction chamber downstream from the metering plate to direct reactant gas passing through the slot across a wafer supported by the susceptor; and
    a plenum positioned upstream from the metering plate for providing reactant gas to the metering plate at a substantially constant pressure.

10. An injector for use in a reactor for depositing an epitaxial layer on a semiconductor wafer supported within a reaction chamber of the reactor during a chemical vapor deposition process, the injector comprising a metering plate having a slot extending through the plate totally within a periphery of the plate, said slot being sized for selectively restricting reactant gas flow past the plate thereby to meter reactant gas delivery to the reaction chamber.

11. An injector as set forth in claim 10 wherein the slot has a width of less than about 0.02 inches.

12. An injector as set forth in claim 11 wherein said slot has a width of between about 0.002 inches and about 0.015 inches.

13. An injector as set forth in claim 10 wherein said slot is a central slot positioned upstream from a central portion of the reactor for metering reactant gas passing over a central portion of a wafer supported within the reactor, and the injector has at least two side slots positioned adjacent to opposite ends of the central slot, each of said side slots being positioned upstream from opposite outer portions of the reactor for metering reactant gas passing over corresponding outer portions of the wafer.

14. An injector as set forth in claim 13 wherein said central and side slots have generally uniform widths along their respective lengths.

15. An injector as set forth in claim 13 wherein each of said side slots has a width less than a width of said central slot.

16. An injector as set forth in claim 15 wherein said central slot has a width of less than about 0.02 inches and each side slot has a width of less than about 0.01 inches.

17. An injector as set forth in claim 16 wherein said central slot has a width of between about 0.009 inches and about 0.015 inches and wherein each side slot has a width of between about 0.002 inches and about 0.005 inches.

18. An injector as set forth in claim 10 further comprising:
an inlet body adapted for attachment to the reactor downstream from the metering plate to direct reactant gas passing through the slot across a surface of a wafer supported within the reactor; and
a plenum positioned upstream from the metering plate for providing reactant gas to the metering plate at a substantially constant pressure.

\* \* \* \* \*